(12) United States Patent
Choung et al.

(10) Patent No.: US 9,741,827 B2
(45) Date of Patent: Aug. 22, 2017

(54) ETCHANT AND METHOD OF MANUFACTURING DISPLAY DEVICE BY USING THE SAME

(71) Applicants: Samsung Display Co., Ltd., Yongin, Gyeonggi-Do (KR); DONGWOO FINE-CHEM Co., Ltd., Iksan, Jeonrabuk-Do (KR)

(72) Inventors: Jong-Hyun Choung, Yongin (KR); In-Bae Kim, Yongin (KR); Hong-Sick Park, Yongin (KR); Seon-Il Kim, Yongin (KR); In-Seol Kuk, Iksan (KR); Gi-Yong Nam, Iksan (KR); Young-Chul Park, Iksan (KR); In-Ho Yu, Iksan (KR); Young-Jin Yoon, Iksan (KR); Suck-Jun Lee, Iksan (KR)

(73) Assignees: Samsung Display Co., Ltd., Yongin, Gyeonggi-do (KR); Dongwoo Fine-Chem Co., Ltd., Iksan, Joenrabuk-do (KR)

( * ) Notice: Subject to any disclaimer, the term of this patent is extended or adjusted under 35 U.S.C. 154(b) by 0 days.

(21) Appl. No.: 14/508,858

(22) Filed: Oct. 7, 2014

(65) Prior Publication Data
US 2015/0307779 A1  Oct. 29, 2015

(30) Foreign Application Priority Data
Apr. 28, 2014  (KR) ........................ 10-2014-0050924

(51) Int. Cl.
*C23F 1/18* (2006.01)
*H01L 29/66* (2006.01)
*H01L 27/12* (2006.01)
*H01L 21/3213* (2006.01)
(Continued)

(52) U.S. Cl.
CPC .......... *H01L 29/66765* (2013.01); *C23F 1/02* (2013.01); *C23F 1/18* (2013.01);
(Continued)

(58) Field of Classification Search
None
See application file for complete search history.

(56) References Cited

U.S. PATENT DOCUMENTS 6,066,028 A * 5/2000 Cheng ................... B24B 37/042
257/E21.304
2002/0076930 A1* 6/2002 Jo ............................ C23F 1/18
438/689
(Continued)

FOREIGN PATENT DOCUMENTS

KR    10-2004-0000801 A    1/2004
KR    10-2010-0040010 A    4/2010
(Continued)

OTHER PUBLICATIONS

LaSurface.com, "Beginners or experienced users of spectrometries surface analyses, (XPS, AES, and UPS) are all welcome to exchange and share data in this forum and disseminate their results by adding them to the data base.", http://www.lasurface.com/accueil/index.php, Oct. 1, 2010.

*Primary Examiner* — Duy T Nguyen
*Assistant Examiner* — Bo Bin Jang
(74) *Attorney, Agent, or Firm* — Knobbe Martens Olson & Bear LLP (57) ABSTRACT

An etchant composition is provided comprising a persulfate from 0.5 to 20 wt %; a fluoride compound from 0.01 to 2 wt %; an inorganic acid from 1 to 10 wt %; a N (nitrogen atom)-containing heterocyclic compound from 0.5 to 5 wt %; a chloride compound from 0.1 to 5 wt %; a copper salt from 0.05 to 3 wt %; an organic acid or an organic acid salt from 0.1 to 10 wt %; an electron-donating compound from at 0.1 to 5 wt %; and a solvent of the residual amount. Also provided is a method of manufacturing a display device by using the same.

7 Claims, 4 Drawing Sheets

(51) Int. Cl.
*C23F 1/02* (2006.01)
*C23F 1/26* (2006.01)
*H01L 29/45* (2006.01)
*H01L 29/49* (2006.01)

(52) U.S. Cl.
CPC .......... *C23F 1/26* (2013.01); *H01L 21/32134* (2013.01); *H01L 27/124* (2013.01); *H01L 27/1259* (2013.01); *H01L 29/458* (2013.01); *H01L 29/4908* (2013.01)

(56) References Cited

U.S. PATENT DOCUMENTS

| | | |
|---|---|---|
| 2004/0072444 A1 | 4/2004 | Park et al. |
| 2010/0252530 A1 | 10/2010 | Durante et al. |
| 2010/0301010 A1 | 12/2010 | Lin et al. |
| 2011/0177680 A1* | 7/2011 | Lee ................ C09K 13/08 438/478 |
| 2012/0252148 A1 | 10/2012 | Park et al. |
| 2013/0026134 A1* | 1/2013 | Nakagawa .......... H01L 21/0337 216/55 |
| 2013/0034923 A1 | 2/2013 | Kim et al. |

FOREIGN PATENT DOCUMENTS

| | | |
|---|---|---|
| KR | 10-2010-0064361 A | 6/2010 |
| KR | 10-2010-0110745 A | 10/2010 |
| KR | 10-2012-0051488 A | 5/2012 |
| KR | 10-2012-0111636 A | 10/2012 |
| KR | 10-2013-0015943 A | 2/2013 |
| KR | 10-2013-0046065 A | 5/2013 |

* cited by examiner

ETCHANT AND METHOD OF MANUFACTURING DISPLAY DEVICE BY USING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2014-0050924, filed on Apr. 28, 2014, in the Korean Intellectual Property Office, the disclosure of which is incorporated herein in its entirety by reference.

BACKGROUND

Field

The disclosure relates to an etchant and a method of manufacturing a display device by using the same.

Description of the Related Technology

Generally, a thin film transistor (TFT) display panel is used as a circuit board to independently drive each pixel on a liquid crystal display or an organic electroluminescence display. A TFT display panel includes a scanning signal wiring or a gate wiring for transmitting a scanning signal, an image signal wiring or a data wiring for transmitting an image signal, a TFT which is connected with a gate wiring and a data wiring, and a pixel electrode which is connected with a TFT.

When a TFT display panel is manufactured, metal layers for a gate wiring and a data wiring are laminated on a substrate, and then the metal layers are etched.

Copper, which has high electrical conductivity and low resistance, is used to prepare a gate wiring and a data wiring. Since photoresist coating and patterning are difficult to perform in a process using copper, multiple metal layers, rather than a single copper layer, are used to prepare a gate wiring and a data wiring.

Among multiple metal layers, a titanium/copper double layer is widely used. When a titanium/copper double layer is simultaneously etched, the etching profile is bad and a subsequent process becomes difficult.

SUMMARY

One or more embodiments of the present invention provide an etchant and a method of manufacturing a display device by using the same.

One embodiment of the present invention provides an etchant including a persulfate from about 0.5 wt % to about 20 wt %; a fluoride compound from about 0.01 wt % to about 2 wt %; an inorganic acid from about 1 wt % to about 10 wt %; a N (nitrogen atom)-containing heterocyclic compound from about 0.5 wt % to about 5 wt %; a chloride compound from about 0.1 wt % to about 5 wt %; a copper salt from about 0.05 wt % to about 3 wt %; an organic acid or an organic acid salt from about 0.1 wt % to about 10 wt %; an electron-donating compound from about 0.1 wt % to about 5 wt %; and a solvent of the residual amount.

Another embodiment of the present invention provides a method of manufacturing a display device, the method including forming a gate metal layer including a upper gate metal layer and a lower gate metal layer on an insulating substrate; etching the gate metal layer by using the etchant according to one example of the present invention to form a gate line including a gate electrode; forming a gate insulating layer on the gate line, forming on the gate insulating layer a first amorphous silicon layer, a second amorphous silicon layer, a lower data metal layer, and an upper data metal layer sequentially; etching the first amorphous silicon layer, the second amorphous silicon layer, the lower data metal layer, and the upper data metal layer to form a semiconductor layer, a resistive contact layer, a data line including a source electrode, and a drain electrode; forming a protective layer on the data line, the drain electrode, and the gate insulating layer; and forming on the protective layer a pixel electrode that is connected with the drain electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The described technology may be variously converted and have various embodiments, and specific examples are illustrated in the drawings and described in detail in a detailed description section. The advantages and features of the described technology and the method for achieving them will be apparent by referring to example described in detail hereinafter along with attached drawings. However, the described technology is not limited to the examples disclosed in the following, and may be embodied by various different forms.

Hereinafter, embodiments of the described technology will be described in greater detail with reference to the accompanying drawings. In providing descriptions referring to the accompanying drawings, those components that are the same or are in correspondence are rendered the same reference numeral regardless of the figure number, and redundant descriptions are omitted.

As used herein, the singular forms "a," "an" and "the" are intended to include the plural forms as well, unless the context clearly indicates otherwise.

In the following embodiments, it will be further understood that the terms "comprises" and/or "comprising" used herein specify the presence of stated features or components, but do not preclude the presence or addition of one or more other features or components.

In the following embodiments, it will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

An etchant according to an embodiment is described hereinafter.

An etchant according to an embodiment etches a metal line formed by using a Ti layer or a Ti-containing metal layer or formed by using a double layer including a copper metal layer or a copper-containing metal layer on a Ti layer or a Ti-containing metal layer.

An etchant according to an embodiment includes a persulfate, a fluoride compound, an inorganic acid, a N-containing heterocyclic compound, a chloride compound, a copper salt, an organic acid or an organic acid salt, an electron-donating compound, and a solvent of the residual amount.

An etchant according to an embodiment may be a non-hydrogen peroxide etchant. Hereinafter, a non-hydrogen peroxide etchant refers to an etchant, which does not include hydrogen peroxide.

The persulfate is the main substance which etches a copper layer or a copper-containing metal layer. The persulfate may be included in a ratio from about 5 wt % to about 20 wt % of a total weight of the etchant. When the ratio of the persulfate is within the range, a rate of etching a copper layer or a copper-containing metal layer may be rapid but maintained at a range which allows for appropriately controlling the etching process.

The persulfate may include at least one selected from the group consisting of potassium persulfate, sodium persulfate, and ammonium persulfate, but is not limited thereto.

The fluoride compound is the main substance which etches a titanium layer or a titanium-containing metal layer and plays the role of removing a residue which may be generated during etching. The fluoride compound may be included in a ratio from about 0.01 wt % to about 2 wt % of a total weight of the etchant. When the ratio of the fluoride compound is within the range, a rate of etching a titanium layer or a titanium-containing metal layer is rapid so that no residue may be generated and no damage is made to a substrate such as glass on which a metal wiring is formed or to an insulating layer, including silicon, which is formed along with the metal wiring.

The fluoride compound may be a compound from which a fluoride ion is dissociated or include at least one selected from the group consisting of ammonium fluoride, sodium fluoride, potassium fluoride, ammonium bifluoride, sodium bifluoride, and potassium bifluoride, but is not limited thereto.

The inorganic acid is an auxiliary oxidant for etching a copper layer or a copper-containing metal layer and a titanium layer or a titanium-containing metal layer and may be included in a ratio from about 1 wt % to about 10 wt % of a total weight of the etchant. When the ratio of the inorganic acid is within the range, a rate of etching a copper layer or a copper-containing metal layer and a titanium layer or a titanium-containing metal layer is rapid so that the etching profile may be good, no residual may be generated, over-etching or photoresist cracks may be avoided to prevent wiring detachment by etchant penetration.

The inorganic acid may be at least one selected from the group consisting of nitric acid, sulfuric acid, phosphoric acid, and perchloric acid.

The N-containing heterocyclic compound controls the rate of etching a copper layer and a copper-containing metal layer. The N-containing heterocyclic compound may be included in a ratio from about 0.5 wt % to about 5 wt % of a total weight of the etchant. When the ratio of the N-containing heterocyclic compound is within the range, the copper etching rate may be controlled so that over-etching may be prevented, process time may be prevented from being too long due to a too slow copper etching rate, and productivity may be increased.

The N-containing heterocyclic compound may include at least one selected from the group consisting of 5-aminotetrazole, 1H-1,2,4-triazol-3-amine, 4H-1,2,4-triazol-4-amine, benzotriazole, imidazole, indole, purine, pyrazole, pyridine, pyrimidine, pyrrole, pyrrolidine, and pyrroline, but is not limited thereto.

The chloride compound plays the role of an auxiliary oxidant etching a copper layer or copper-containing metal layer and controls a taper angle. The chloride compound may be included in a ratio from about 0.1 wt % to about 5 wt % of a total weight of the etchant. When the ratio of the chloride compound is lower than 0.1 wt %, the copper or copper-containing metal layer etching rate becomes low so that an etching profile may be bad. When the ratio of the chloride compound is higher than 5 wt %, over-etching may take place so that a metal wiring may be lost.

The chloride compound refers to a compound which may be dissociated to a chloride ion and may include at least one selected from the group consisting of hydrochloric acid (HCl), sodium chloride (NaCl), potassium chloride (KCl), and ammonium chloride ($NH_4Cl$), but is not limited thereto.

The copper salt controls cut dimension (CD) skew and may be included in a ratio from about 0.05 wt % to about 3 wt % of a total weight of the etchant. When the ratio of the copper salt is lower than 0.05 wt %, the fluctuation of CD skew may be severe depending on the number of treated wafers. When the ratio of the chloride compound is higher than 3 wt %, the oxidizing power of a main oxidant is decreased so that the number of treated wafers may be decreased.

The copper salt may include at least one selected from the group consisting of copper nitrate ($Cu(NO_3)_2$), copper sulfate ($CuSO_4$), and ammonium copper phosphate ($NH_4CuPO_4$) but is not limited thereto.

The organic acid or the organic acid salt prevents etched metal ions from affecting an etchant by chelating and thereby increasing the number of treated wafers. The organic acid or the organic acid salt may be included in a ratio from about 0.1 wt % to about 10 wt % of a total weight of the etchant. When the ratio of an organic acid or an organic acid salt is lower than 1 wt %, the number of treated wafers is not increased. When the ratio of the organic acid or the organic acid salt is higher than 10 wt %, the number of treated wafers is not increased any further.

The organic acid or the organic acid salt may include at least one selected from the group consisting of acetic acid, butanoic acid, citric acid, formic acid, gluconic acid, glycolic acid, malonic acid, pentanoic acid, sulfobenzoic acid, sulfosuccinic acid, sulfophthalic acid, salicylic acid, sulfosalicylic acid, benzoic acid, glyceric acid, succinic acid, malic acid, tartaric acid, isocitric acid, propenoic acid, iminodiacetic acid, and ethylenediaminetetraacetic acid (EDTA), and a sodium salt, a potassium salt, and an ammonium salt thereof, but is not limited thereto.

The electron-donating compound is an additive which prevents a composition having etching power from generating a precipitate due to binding with a copper ion generated by process of copper wiring etching by inducing precipitation bonding interference. The electron-donating compound may be included in a ratio from about 0.1 wt % to about 5 wt % of a total weight of the etchant. When the ratio of an electron-donating compound is lower than 0.1 wt %, it is highly probable that an insoluble precipitate may be generated. When the ratio of an electron-donating compound is higher than 5 wt %, it may be difficult to maintain a pre-existing etching performance.

The electron-donating compound, may include at least one selected from the group consisting of L-isoleucine, oxalic acid, adipic acid, palmitic acid, lactic acid, maleic acid, $N^1$-(2-aminoethyl)ethane-1,2-diamine pentaacetate, N-acetyl-L-cysteine, L-serine, and L-methionine, and a potassium salt, a sodium salt, and an ammonium salt thereof, but is not limited thereto. For example, the electron-donating compound may include at least one selected from the group consisting of isoleucine, diethylene triamine pentaacetic acid, acetyl cysteine, serine, and methionine, and a potassium salt, a sodium salt, and an ammonium salt thereof, but is not limited thereto.

An etchant including a persulfate, a fluoride compound, an organic acid, an inorganic acid, a chloride compound, a copper salt, a N-containing heterocyclic compound, and a solvent may generate an insoluble precipitate, when a copper ion generated in the etching process is combined with at least one of the compounds included in the etchant. The insoluble precipitate may cause contamination of an etched substrate and occlusion of a pipe used for an etching process.

Table 1 below shows results of experiments to determine whether an insoluble precipitate is generated from an etchant necessarily including a persulfate, a fluoride compound, an organic acid, an inorganic acid, a copper salt, and a solvent and selectively including a chloride compound and/or an N-containing heterocyclic compound. Experimental Examples 1 to 3 in Table 1 show the variation of copper concentration in an etchant in which Cu 3500 ppm is dissolved. A decreased concentration herein indicates that precipitation is formed equivalent to decrease in the copper concentration.

TABLE 1

| | SPS (wt %) | ABF (wt %) | $HNO_3$ (wt %) | ATZ (wt %) | NaCl (wt %) | $CuSO_4$ (wt %) | AcOH (wt %) | Cu concentration (ppm) | | |
|---|---|---|---|---|---|---|---|---|---|---|
| | | | | | | | | Day 1 | Day 5 | Day 12 |
| Experimental Example 1 | 10 | 0.5 | 3 | — | 1.5 | 0.2 | 3 | 3510 | 3580 | 3630 |
| Experimental Example 2 | 10 | 0.5 | 3 | 1.5 | — | 0.2 | 3 | 3480 | 3520 | 3620 |
| Experimental Example 3 | 10 | 0.5 | 3 | 1.5 | 1.5 | 0.2 | 3 | 3400 | 2310 | 2280 |

※SPS: sodium persulfate
※ABF: ammonium bifluoride
※ATZ: 5-aminotetrazole
※AcOH: acetic acid As shown in Table 1, the copper concentration was not changed in an etchant including neither an N-containing heterocyclic compound nor a chloride compound (Experimental Examples 1 and 2), while the copper concentration was decreased in Experimental Example 3 where an etchant included both an N-containing heterocyclic compound and a chloride compound. Therefore, an etchant including both an N-containing heterocyclic compound and a chloride compound may generate an insoluble precipitate. An excess of copper ions generated during the etching process may accelerate the rate of the insoluble precipitate generation.

Table 2 below shows results of experiments to determine whether an insoluble precipitate is generated depending on the ratio of a chloride compound.

TABLE 2

| | SPS (wt %) | ABF (wt %) | $HNO_3$ (wt %) | ATZ (wt %) | NaCl (wt %) | $CuSO_4$ (wt %) | AcOH (wt %) | Cu concentration (ppm) | | |
|---|---|---|---|---|---|---|---|---|---|---|
| | | | | | | | | Day 1 | Day 3 | Day 6 |
| Experimental Example 4 | 10 | 0.5 | 3 | 1.5 | 1.5 | 0.2 | 3 | 3440 | 2800 | 2370 |
| Experimental Example 5 | 10 | 0.5 | 3 | 1.5 | 1.2 | 0.2 | 3 | 3060 | 3000 | 2920 |

TABLE 2-continued

|  | SPS (wt %) | ABF (wt %) | HNO₃ (wt %) | ATZ (wt %) | NaCl (wt %) | CuSO₄ (wt %) | AcOH (wt %) | Cu concentration (ppm) | | |
|---|---|---|---|---|---|---|---|---|---|---|
|  |  |  |  |  |  |  |  | Day 1 | Day 3 | Day 6 |
| Experimental Example 6 | 10 | 0.5 | 3 | 1.5 | 1.0 | 0.2 | 3 | 3060 | 3040 | 3000 |
| Experimental Example 7 | 10 | 0.5 | 3 | 1.5 | 0.6 | 0.2 | 3 | 3040 | 3020 | 3050 |
| Experimental Example 8 | 10 | 0.5 | 3 | 1.5 | 0.4 | 0.2 | 3 | 3050 | 3040 | 3060 |

※SPS: sodium persulfate
※ABF: ammonium bifluoride
※ATZ: 5-aminotetrazole
※AcOH: acetic acid As shown in Table 2, when the ratio of a chloride compound was decreased, the generation of an insoluble precipitate significantly decreased. However, a decrease in the amount of a chloride compound makes it impossible to maintain appropriate etching performance, and thus simply decreasing the ratio of a chloride compound is not a fundamental solution for repressing the generation of an insoluble precipitate.

An etchant according to an example of the present invention may include an electron-donating compound, and the electron-donating compound may chelate with the copper ions, hence including an electron-donating compound may not generate an insoluble precipitate.

An etchant according to an example of the present invention includes a residual solvent which makes a total weight be 100 wt %. The residual solvent may be water, and the water may be deionized water. For example, the water may be water for a semiconductor process having an electrical resistivity of 18 MΩ/cm or higher, but is not limited thereto.

In addition, an etchant according to an example of the present invention may further include a sequestrant, an anticorrosive agent, and others.

An etchant according to an example of the present invention may be used to effectively etch a metal wiring formed by using a Ti layer or a Ti-containing metal layer or formed by using a double layer including a copper metal layer or a copper-containing metal layer on a Ti layer or a Ti-containing metal layer.

In addition, an etchant according to an example of the present invention may be used for manufacturing not only a flat panel display such as a liquid crystal display device but also a memory semiconductor display panel. In addition, an etchant according to an example of the present invention may be used for manufacturing another electronic device including a metal wiring formed by using a Ti layer or a Ti-containing metal layer or formed by using a double layer including a copper metal layer or a copper-containing metal layer on a Ti layer or a Ti-containing metal layer.

Described hereinafter is a method of manufacturing a display device by using an etchant according to an example of the present invention described above.

Figure 1:
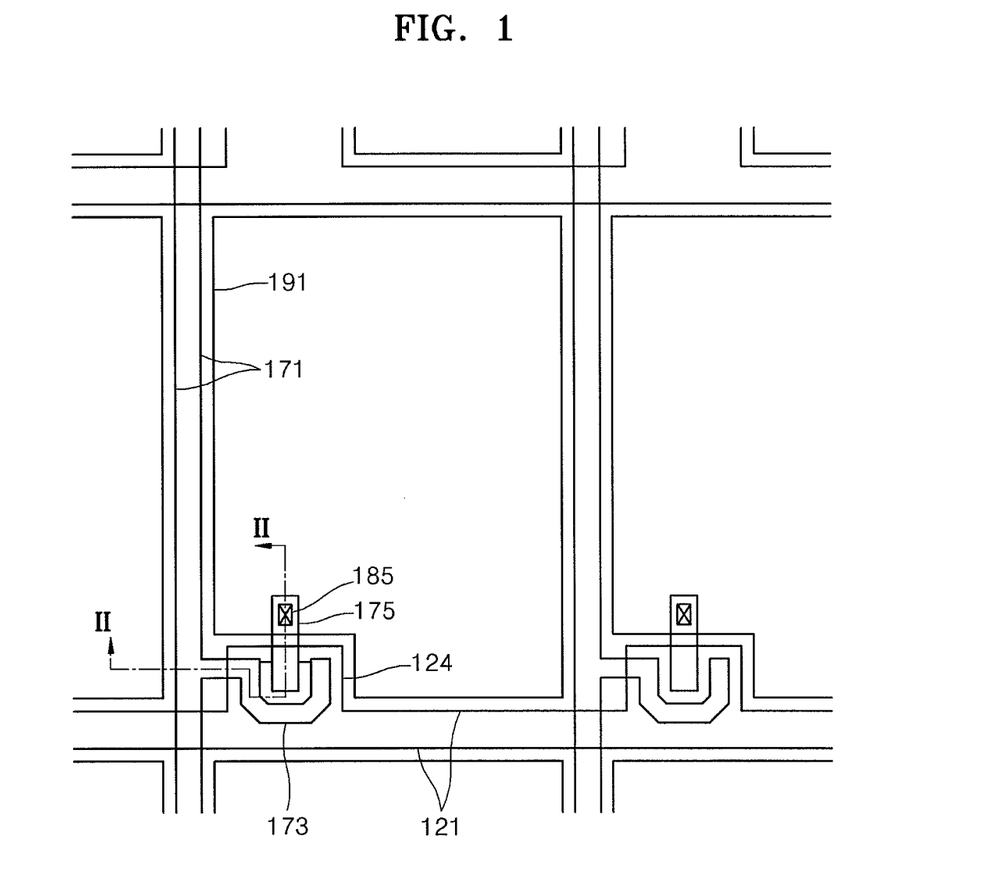
FIG. 1 is cross-sectional view showing a display device according to an example of the present invention.
Figure 2:
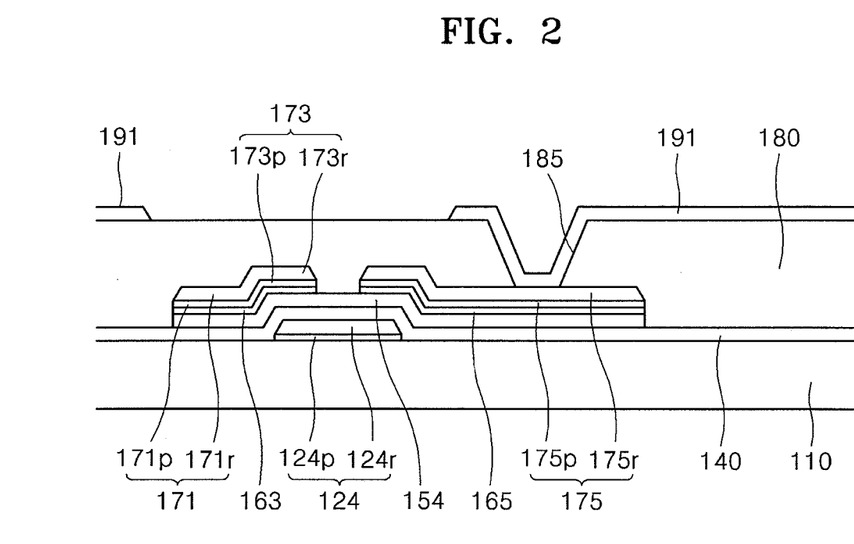
FIG. 2 is a cross-sectional view taken along line II-II in FIG. 1.

FIG. 1 is a layout of a TFT display panel for a display device according to an example of the present invention. FIG. 2 is a cross-sectional view taken along line II-II in FIG. 1.

The TFT display panel for a display device according to an example of the present invention includes on a substrate (110) formed by using an insulator such as glass or plastic gate lines (121) including the gate electrode (124), on which a gate insulating layer (140), semiconductor layers (154), resistive contact members (163, 165), data lines (171), and drain electrodes (175) are formed in this order.

The gate line (121) transmits a gate signal and usually extends in a horizontal direction. The gate electrode (124) protrudes from the gate line (121).

The gate line (121) is formed by using a lower layer (124p) and an upper layer (124r), wherein the lower layer (124p) is formed by using titanium or a titanium-containing metal and the an upper layer (124r) is formed by using copper or a copper-containing metal.

The data line (171) transmits a data signal and usually extends in a vertical direction across the gate line (121). Each data line (171) includes source electrodes (173) extending toward the gate electrode (124). A drain electrode (175) is separate from the data line (171) and faces the source electrode (173) around the gate electrode (124).

The data line (171), the source electrode (173), and the drain electrode (175) are formed by using lower layers (171p, 173p, 175p) and upper layers (171r, 173r, 175r), wherein the lower layers (171p, 173p, 175p) are formed by using titanium or a titanium-containing metal and the upper layers (171r, 173r, 175r) are formed by using copper or a copper-containing metal.

The semiconductor layer (154) is located on the gate electrode (124). The resistive contact members (163, 165) on the semiconductor layer (154) are arranged only between the semiconductor layer (154) and the data line (171) and between the semiconductor layer (154) and the drain electrode (175) to decrease the contact resistance between the semiconductor layer (154) and the data line (171) and between the semiconductor layer (154) and the drain electrode (175).

One gate electrode (124), one source electrode (173), and one drain electrode (175) as well as the semiconductor layer (154) are used to form a TFT. A TFT channel is formed on the semiconductor layer (154) between the source electrode (173) and the drain electrode (175).

On the data line (171) and the drain electrode (175), a protective layer (180), which is formed by using silicon nitride or silicon oxide, is formed.

In the protective layer (180), a contact hole (185), which exposes the drain electrode (175), is formed. On the protective layer (180), a pixel electrode (191) is formed, wherein the pixel electrode (191) is connected with the drain electrode (175) through the contact hole (185).

A method of manufacturing a TFT display panel for a display device, according to an example of the present invention, is described with reference to FIGS. 3 to 8 and FIG. 2.

FIGS. 3 to 8 are cross-sectional views illustrating a method of manufacturing a TFT display panel for a display device, according to an example of the present invention in order.

Figure 3:
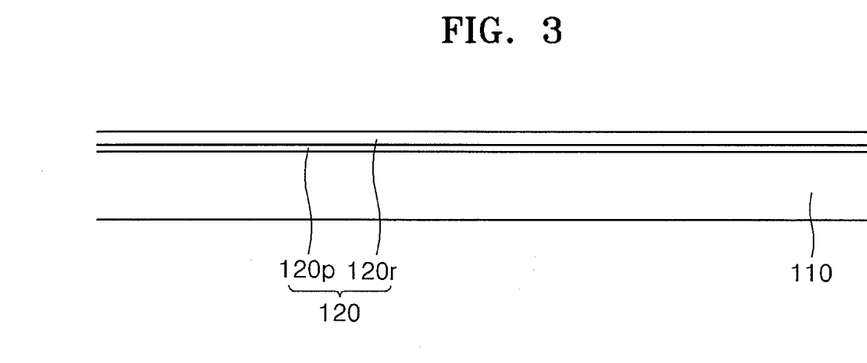
FIGS. 3 to 8 are cross-sectional views showing a method of manufacturing a display device, according to an example of the present invention.

As shown in FIG. 3, on a transparent insulating substrate (110), a gate metal layer (120) is formed, wherein the gate metal layer (120) includes a lower gate metal layer (120p) which is formed by using titanium or a titanium-containing metal and an upper gate metal layer (120r) which is formed by using copper or a copper-containing metal.

Figure 4:
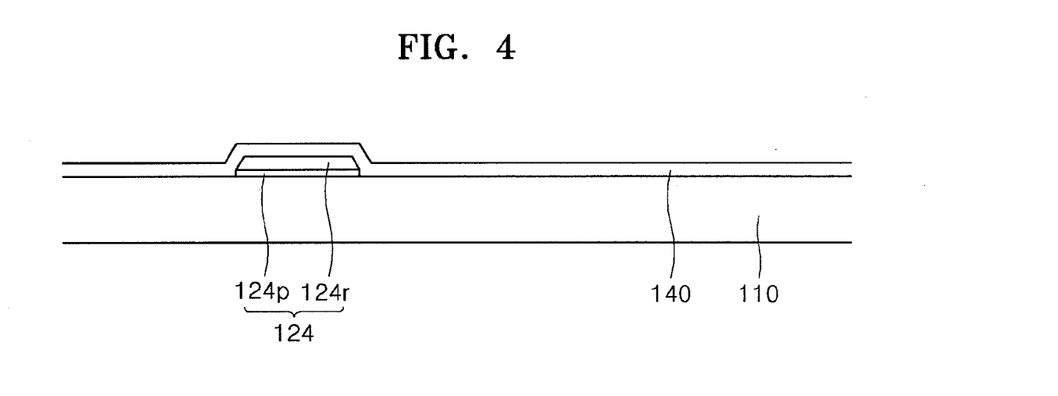

Subsequently, as shown in FIG. 4, an etchant according to an example described above is used to etch the gate metal layer (120) to form a gate electrode (124) and a gate insulating layer (140) on a front surface of the insulating substrate (110) including the gate electrode (124).

The gate electrode (124) includes a lower layer (124p) and an upper layer (124r), wherein the lower layer (124p) is formed by using titanium or a titanium-containing metal and the upper layer (124r) is formed by using copper or a copper-containing metal.

Figure 5:
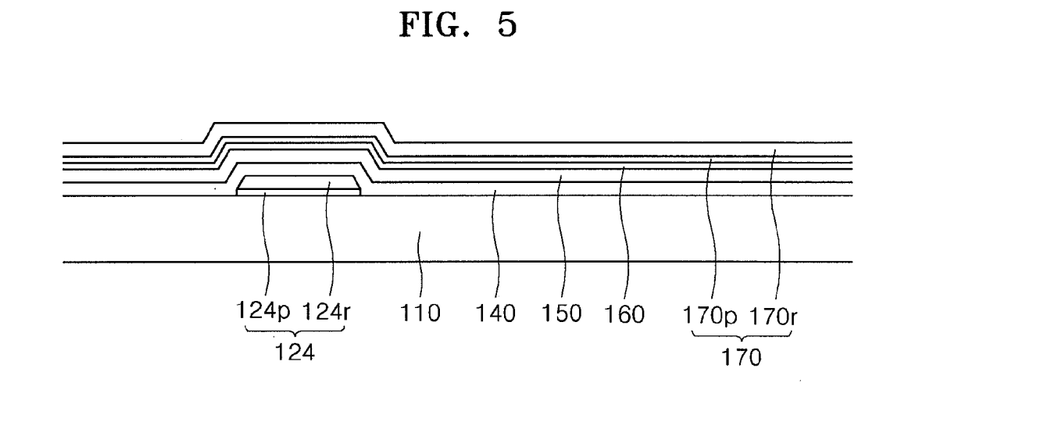

Then, as shown in FIG. 5, on the gate insulating layer (140), an amorphous silicon layer (150), an impurity-doped amorphous silicon layer (160), and data metal layer (170) are laminated in this order. The data metal layer (170) includes a lower data metal layer (170p) and an upper data metal layer (170r), wherein the data metal layer (170p) is formed by using titanium or a titanium-containing metal and the upper data metal layer (170r) is formed by using copper or a copper-containing metal.

Figure 6:
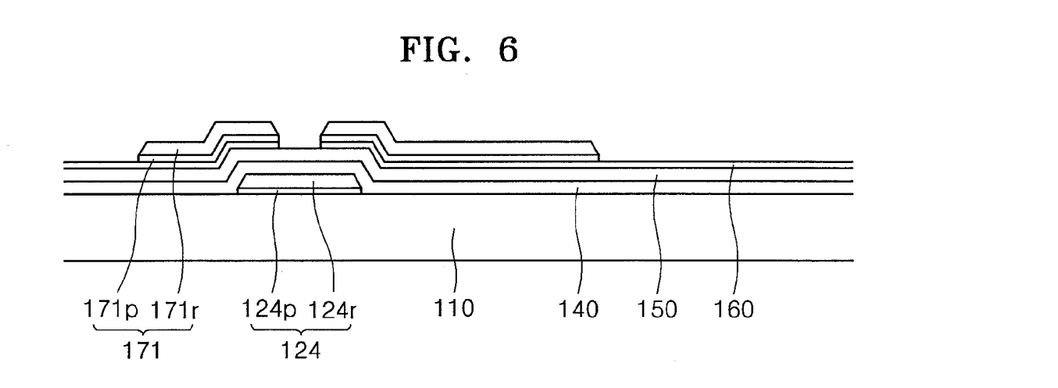
Figure 7:
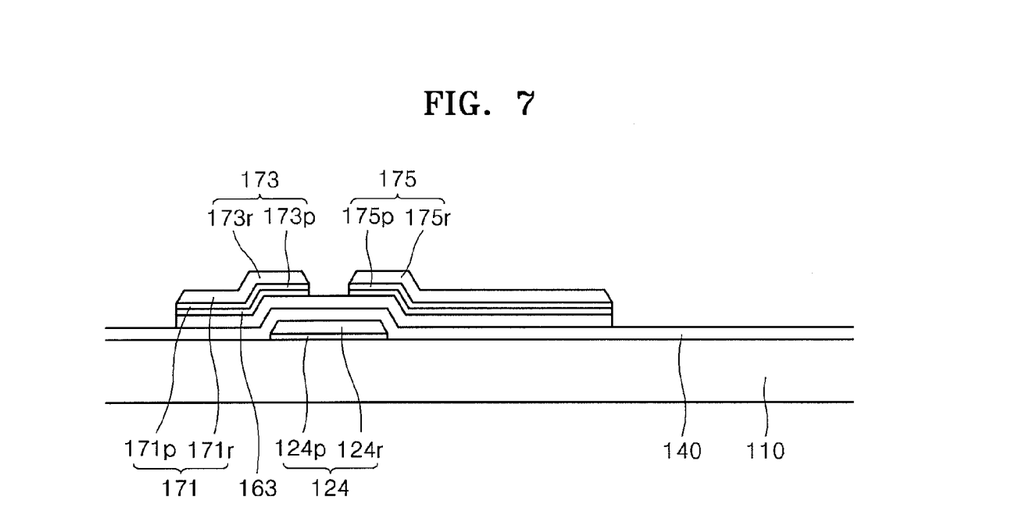

Afterward, as shown in FIGS. 6 and 7, an etchant according to an example described above is used to etch the data metal layer (170) and then the amorphous silicon layer (150) and the impurity-doped amorphous silicon layer (160) to form a data line (171) including a source electrode (173), a drain electrode (175), resistive contact layers (163, 165), and a semiconductor layer (154).

A data line (171), the source electrode (173), and the drain electrode (175) include lower layers (171p, 173p, 175p) and upper layers (171r, 173r, 175r), wherein the lower layers (171p, 173p, 175p) are formed by using titanium or a titanium-containing metal and the upper layers (171r, 173r, 175r) are formed by using copper or a copper-containing metal.

Figure 8:
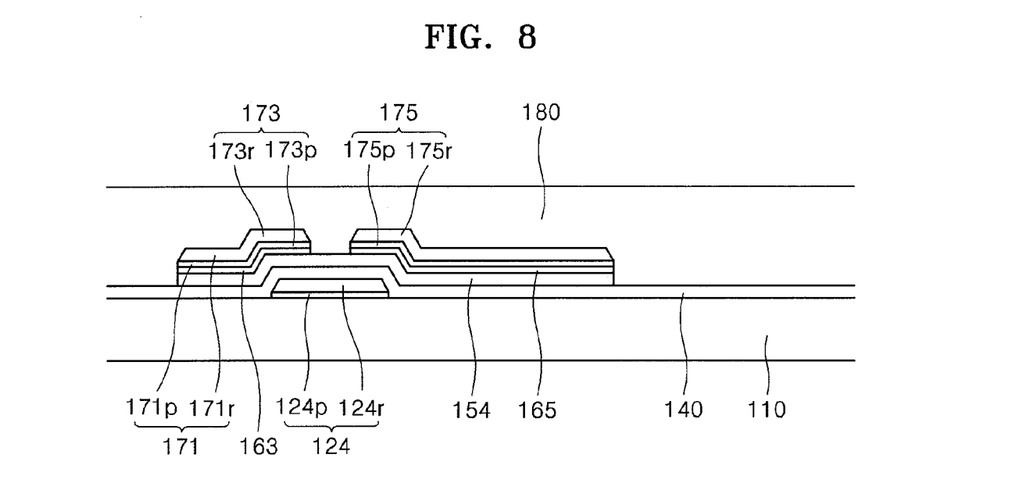

Subsequently, as shown in FIG. 8, a protective layer (180) is formed on a front surface including the data line (171), the drain electrode (175), and the gate insulating layer (140). Then, as shown in FIG. 2, a contact hole (185), which exposes a drain electrode (175), is formed in the protective layer (180), and a pixel electrode (191) is formed on the protective layer (180).

Hereinafter, the performance of an etchant according to an example of the present invention is described through specific experimental examples. Although examples of the present invention have been described, the scope of the present invention is not limited thereto.

EXAMPLE 1

As shown in Table 3 below, 10 kg of an etchant was prepared by using sodium persulfate 10 wt %, ammonium bifluoride 0.5 wt %, nitric acid 3 wt %, 5-aminotetrazole 1.5 wt %, sodium chloride 1.5 wt %, copper sulfate 0.2 wt %, acetic acid 3 wt %, diethylene triamine pentaacetic acid 3 wt %, and residual water.

EXAMPLE 2

As shown in Table 3 below, 10 kg of an etchant was prepared by using sodium persulfate 10 wt %, ammonium bifluoride 0.5 wt %, nitric acid 3 wt %, 5-aminotetrazole 1.5 wt %, sodium chloride 1.5 wt %, copper sulfate 0.2 wt %, acetic acid 3 wt %, N-acetyl L-cysteine 3 wt %, and residual water.

EXAMPLE 3

As shown in Table 3 below, 10 kg of an etchant was prepared by using sodium persulfate 10 wt %, ammonium bifluoride 0.5 wt %, nitric acid 3 wt %, 5-aminotetrazole 1.5 wt %, sodium chloride 1.5 wt %, copper sulfate 0.2 wt %, acetic acid 3 wt %, L-methionine 3 wt %, and residual water.

COMPARATIVE EXAMPLE 1

As shown in Table 3 below, 10 kg of an etchant was prepared by using sodium persulfate 10 wt %, ammonium bifluoride 0.5 wt %, nitric acid 3 wt %, 5-aminotetrazole 1.5 wt %, sodium chloride 1.5 wt %, copper sulfate 0.2 wt %, acetic acid 3 wt %, and residual water.

TABLE 3

| | SPS (wt %) | ABF (wt %) | HNO₃ (wt %) | ATZ (wt %) | NaCl (wt %) | CuSO₄ (wt %) | AcOH (wt %) | Electron-donating compound Additive | Ratio | Precipitate after keeping at -9° C. Day 1 | Day 7 | Day 15 |
|---|---|---|---|---|---|---|---|---|---|---|---|---|
| Example 1 | 10 | 0.5 | 3 | 1.5 | 1.5 | 0.2 | 3 | A-1 | 3 | None | None | None |
| Example 2 | 10 | 0.5 | 3 | 1.5 | 1.5 | 0.2 | 3 | A-2 | 3 | None | None | None |
| Example 3 | 10 | 0.5 | 3 | 1.5 | 1.5 | 0.2 | 3 | A-3 | 3 | None | None | None |
| Comparative Example 1 | 10 | 0.5 | 3 | 1.5 | 1.5 | 0.2 | 3 | — | — | Generated | Increased | Increased |

※SPS: sodium persulfate
※ABF: ammonium bifluoride
※ATZ: 5-aminotetrazole
※AcOH: acetic acid
※A-1: diethylene triamine pentaacetic acid
※A-2: N-acetyl L-cysteine
※A-3: L-methionine

EXPERIMENTAL EXAMPLE 1

Assessment of Precipitate Generation

With respect to etchants according to Examples 1 to 3 and Comparative Example 1 of the present invention, assessment was performed about whether a precipitate was generated, as described below.

Cu 3000 ppm powder was put into a prepared etchant, and the resulting mixture was stirred for about 30 minutes to completely dissolve the Cu powder. Afterward, the resulting solution was put into a polyethylene bottle and kept at a temperature of −9° C. or lower to observe in real time whether a precipitate was generated. Table 4 shows the result.

TABLE 4

| | Precipitate after keeping at −9° C. | | |
|---|---|---|---|
| | Day 1 | Day 7 | Day 15 |
| Example 1 | None | None | None |
| Example 2 | None | None | None |
| Example 3 | None | None | None |
| Comparative Example 1 | Generated | Increased | Increased |

As shown in Table 4, the etchants of Examples 1 to 3 did not generate an insoluble precipitate, while the etchant of Comparative Example 1 generated an insoluble precipitate and the amount increased over time.

EXPERIMENTAL EXAMPLE 2

Assessment of Etching Properties

With respect to etchants according to Examples 1 to 3 of the present invention, an assessment was performed about etching properties as described below.

A SiNx layer was deposited on glass, a titanium layer was laminated on the SiNx layer, and a copper layer was laminated on the titanium layer. A specific shape of photoresist was patterned on the copper layer, which was cut into specimens having a size of 550×650 mm by using a glazier's diamond.

Etchants according to Examples 1 to 3 of the present invention were put into spray etching equipment and heated to 25° C. Then, when the temperature reached 30±0.1° C., an etching process was performed. With respect to the total etching time, 200% over-etching was performed with reference to EPD. After a specimen was put into the equipment, spraying was started. When etching was completed, the specimen was put out and washed with deionized water. Then, the specimen was dried by using a heated-air dryer, and the photoresist was removed by using a photoresist stripper. After washing and drying, etching properties were assessed by using a scanning electron microscope. The results were surprisingly good as shown in Table 5 below.

TABLE 5

| | Assessment |
|---|---|
| Example 1 | Good |
| Example 2 | Good |
| Example 3 | Good |

As shown in Table 5, etchants according Examples 1 to 3 showed good etching properties.

Although examples of the present invention have been described, the scope of the present invention is not limited thereto, and various modifications and alternations using the fundamental concept of the present invention defined in the following claims are also included in the scope of the present invention. For example, although Examples of the present invention relate to a liquid crystal display device, the present invention may be applied to various other types of display devices including a TFT.

As described above, one or more of the above examples of the present invention provides an etchant which provides an excellent etching profile with respect to a titanium/copper double layer and does not generate an insoluble precipitate, and method of manufacturing a display device by using the same.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of manufacturing a display device, the method comprising:
   forming a gate metal layer including an upper gate metal layer and a lower gate metal layer on an insulating substrate;
   etching the gate metal layer with an etchant to form a gate line including a gate electrode;
   forming a gate insulating layer on the gate line;
   forming on the gate insulating layer a first amorphous silicon layer, a second amorphous silicon layer, a lower data metal layer, and an upper data metal layer sequentially;
   etching the first amorphous silicon layer, the second amorphous silicon layer, the lower data metal layer, and the upper data metal layer to form a semiconductor layer, a resistive contact layer, a data line including a source electrode, and a drain electrode;
   forming a protective layer on the data line, the drain electrode, and the gate insulating layer; and
   forming on the protective layer a pixel electrode that is connected with the drain electrode,
   wherein the etchant comprises;
   a persulfate from about 0.5 wt % to about 20 wt %;
   a fluoride compound from about 0.01 wt % to about 2 wt %;
   an inorganic acid from about 1 wt % to about 10 wt %;
   a N (nitrogen atom)-containing heterocyclic compound from about 0.5 wt % to about 5 wt %;
   wherein the N-containing heterocyclic compound comprises at least one selected from the group consisting of 3-amino-1,2,4-triazole, 4H-1,2,4-triazol-4-amine, and benzotriazole;
   a chloride compound from about 0.1 wt % to about 5 wt %;
   a copper salt from about 0.05 wt % to about 3 wt %;
   an organic acid or an organic acid salt from about 0.1 wt % to about 10 wt %;
   an electron-donating compound from about 0.1 wt % to about 5 wt %;
   wherein the electron donating compound comprises at least one selected from the group consisting of N-acetyl L-cysteine, and L-methionine; and
   a potassium salt, a sodium salt, and an ammonium salt of N-acetyl L-cysteine, and L-methionine; and a residual amount of solvent.

2. The method of manufacturing a display device of claim 1, wherein
the lower gate metal layer and the lower data metal layer comprise titanium or a titanium-containing metal; and
the upper gate metal layer and the upper data metal layer comprise copper or a copper-containing metal.

3. The method of manufacturing a display device of claim 1, wherein the upper data metal layer and the lower data metal layer are etched simultaneously with the etchant.

4. The method of manufacturing a display device of claim 1 wherein, the method further comprising:
etching the gate metal layer with the etchant wherein the inorganic acid comprises at least one selected from the group consisting of nitric acid, sulfuric acid, phosphoric acid, and perchloric acid.

5. The method of manufacturing a display device of claim 1 wherein, the method further comprising:
etching the gate metal layer with the etchant wherein the chloride compound comprises at least one selected from the group consisting of hydrochloric acid (HCl), sodium chloride (NaCl), potassium chloride (KCl), and ammonium chloride ($NH_4Cl$).

6. The method of manufacturing a display device of claim 1 wherein, the method further comprising:
etching the gate metal layer with the etchant wherein the copper salt comprises at least one selected from the group consisting of copper nitrate ($Cu(NO_3)_2$), copper sulfate ($CuSO_4$), and ammonium copper phosphate ($NH_4CuPO_4$).

7. The method of manufacturing a display device of claim 1 wherein, the method further comprising:
etching the gate metal layer with the etchant wherein the organic acid or the organic acid salt comprises at least one selected from the group consisting of acetic acid, butanoic acid, citric acid, formic acid, gluconic acid, glycolic acid, malonic acid, pentanoic acid, sulfobenzoic acid, sulfosuccinic acid, sulfophthalic acid, salicylic acid, sulfosalicylic acid, benzoic acid, glyceric acid, succinic acid, malic acid, tartaric acid, isocitric acid, propenoic acid, iminodiacetic acid, and ethylenediaminetetraacetic acid (EDTA); and
a sodium salt, a potassium salt, and an ammonium salt of acetic acid, butanoic acid, citric acid, formic acid, gluconic acid, glycolic acid, malonic acid, pentanoic acid, sulfobenzoic acid, sulfosuccinic acid, sulfophthalic acid, salicylic acid, sulfosalicylic acid, benzoic acid, glyceric acid, succinic acid, malic acid, tartaric acid, isocitric acid, propenoic acid, iminodiacetic acid, and EDTA.

\* \* \* \* \*